US008433023B2

(12) United States Patent
Harrison

(10) Patent No.: US 8,433,023 B2
(45) Date of Patent: Apr. 30, 2013

(54) METHOD AND APPARATUS FOR GENERATING A PHASE DEPENDENT CONTROL SIGNAL

(75) Inventor: Ronnie M. Harrison, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 13/354,702

(22) Filed: Jan. 20, 2012

(65) Prior Publication Data

US 2012/0137161 A1    May 31, 2012

Related U.S. Application Data

(63) Continuation of application No. 12/562,709, filed on Sep. 18, 2009, now Pat. No. 8,107,580, which is a continuation of application No. 12/178,442, filed on Jul. 23, 2008, now Pat. No. 7,602,876, which is a continuation of application No. 11/203,511, filed on Aug. 12, 2005, now Pat. No. 7,418,071, which is a continuation of application No. 10/186,471, filed on Jun. 28, 2002, now Pat. No. 7,016,451, which is a continuation of application No. 09/260,212, filed on Mar. 1, 1999, now Pat. No. 6,470,060.

(51) Int. Cl.
*H03D 3/24* (2006.01)
*H03L 7/06* (2006.01)
*G06F 1/04* (2006.01)

(52) U.S. Cl.
USPC ............ 375/374; 375/375; 327/157; 703/501

(58) Field of Classification Search .................. 375/354, 375/359–361, 371, 374–376; 327/148, 156–159, 327/536; 713/501
See application file for complete search history.

(56) References Cited

U.S. PATENT DOCUMENTS

| 3,633,174 A | 1/1972 | Griffin |
| 3,886,462 A | 5/1975 | Okano et al. |

(Continued)

FOREIGN PATENT DOCUMENTS

| EP | 0 171 720 A2 | 2/1986 |
| EP | 0 295 515 A1 | 12/1988 |

(Continued)

OTHER PUBLICATIONS

"Draft Standard for a High-Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1-56.

(Continued)

*Primary Examiner* — Lawrence B Williams
(74) *Attorney, Agent, or Firm* — Lerner, David, Littenberg, Krumholz & Mentlik, LLP

(57) ABSTRACT

A computer system with a phase detector that generates a phase dependent control signal according to the phase relationship between a first and second clock signal. The phase detector includes first and second phase detector circuits receiving the first and second clock signals and generating select signals having duty cycles corresponding to the phase relationship between the clock edges of the first and second clock signals. The phase detector also includes a charge pump that receives select signals from the phase detector circuits and produces an increasing or decreasing control signal when the first and second clock signals do not have the predetermined phase relationship, and a non-varying control signal when the first and second clock signals do have the predetermined phase relationship. The delay value of a voltage-controlled delay circuit and the phase relationship between the first and second clock signals to a predetermined phase relationship are thereby adjusted.

19 Claims, 6 Drawing Sheets

U.S. PATENT DOCUMENTS

| | | | |
|---|---|---|---|
| 4,004,100 A | 1/1977 | Takimoto | |
| 4,077,016 A | 2/1978 | Sanders et al. | |
| 4,096,402 A | 6/1978 | Schroeder et al. | |
| 4,404,474 A | 9/1983 | Dingwall | |
| 4,481,625 A | 11/1984 | Roberts et al. | |
| 4,508,983 A | 4/1985 | Allgood et al. | |
| 4,511,846 A | 4/1985 | Nagy et al. | |
| 4,514,647 A | 4/1985 | Shoji | |
| 4,524,448 A | 6/1985 | Hullwegen | |
| 4,573,017 A | 2/1986 | Levine | |
| 4,600,895 A | 7/1986 | Landsman | |
| 4,603,320 A | 7/1986 | Farago | |
| 4,638,187 A | 1/1987 | Boler et al. | |
| 4,638,451 A | 1/1987 | Hester et al. | |
| 4,687,951 A | 8/1987 | McElroy | |
| 4,697,167 A | 9/1987 | O'Keeffe et al. | |
| 4,727,541 A | 2/1988 | Mori et al. | |
| 4,740,962 A | 4/1988 | Kish, III | |
| 4,746,996 A | 5/1988 | Furuhata et al. | |
| 4,773,085 A | 9/1988 | Cordell | |
| 4,789,796 A | 12/1988 | Foss | |
| 4,791,594 A | 12/1988 | Harney et al. | |
| 4,791,622 A | 12/1988 | Clay et al. | |
| 4,818,995 A | 4/1989 | Takahashi et al. | |
| 4,893,087 A | 1/1990 | Davis | |
| 4,902,986 A | 2/1990 | Lesmeister | |
| 4,924,516 A | 5/1990 | Bremer et al. | |
| 4,953,128 A | 8/1990 | Kawai et al. | |
| 4,958,088 A | 9/1990 | Farah-Bakhsh et al. | |
| 4,970,609 A | 11/1990 | Cunningham et al. | |
| 4,972,470 A | 11/1990 | Farago | |
| 4,979,185 A | 12/1990 | Bryans et al. | |
| 4,984,204 A | 1/1991 | Sato et al. | |
| 4,984,255 A | 1/1991 | Davis et al. | |
| 5,020,023 A | 5/1991 | Smith | |
| 5,038,115 A | 8/1991 | Myers et al. | |
| 5,062,082 A | 10/1991 | Choi | |
| 5,075,569 A | 12/1991 | Branson | |
| 5,086,500 A | 2/1992 | Greub | |
| 5,087,828 A | 2/1992 | Sato et al. | |
| 5,113,519 A | 5/1992 | Johnson et al. | |
| 5,120,990 A | 6/1992 | Koker | |
| 5,122,690 A | 6/1992 | Bianchi | |
| 5,128,560 A | 7/1992 | Chern et al. | |
| 5,128,563 A | 7/1992 | Hush et al. | |
| 5,130,565 A | 7/1992 | Girmay | |
| 5,133,064 A | 7/1992 | Hotta et al. | |
| 5,134,311 A | 7/1992 | Biber et al. | |
| 5,150,186 A | 9/1992 | Pinney et al. | |
| 5,165,046 A | 11/1992 | Hesson | |
| 5,168,199 A | 12/1992 | Huffman et al. | |
| 5,179,298 A | 1/1993 | Hirano et al. | |
| 5,182,524 A | 1/1993 | Hopkins | |
| 5,194,765 A | 3/1993 | Dunlop et al. | |
| 5,212,601 A | 5/1993 | Wilson | |
| 5,220,208 A | 6/1993 | Schenck | |
| 5,223,755 A | 6/1993 | Richley | |
| 5,229,929 A | 7/1993 | Shimizu et al. | |
| 5,233,314 A | 8/1993 | McDermott et al. | |
| 5,233,564 A | 8/1993 | Ohshima et al. | |
| 5,239,206 A | 8/1993 | Yanai | |
| 5,243,703 A | 9/1993 | Farmwald et al. | |
| 5,253,360 A | 10/1993 | Hayashi | |
| 5,254,883 A | 10/1993 | Horowitz et al. | |
| 5,256,989 A | 10/1993 | Parker et al. | |
| 5,257,294 A | 10/1993 | Pinto et al. | |
| 5,258,936 A | 11/1993 | Gallup et al. | |
| 5,268,639 A | 12/1993 | Gasbarro et al. | |
| 5,272,729 A | 12/1993 | Bechade et al. | |
| 5,274,276 A | 12/1993 | Casper et al. | |
| 5,276,642 A | 1/1994 | Lee | |
| 5,278,460 A | 1/1994 | Casper | |
| 5,281,865 A | 1/1994 | Yamashita et al. | |
| 5,283,631 A | 2/1994 | Koerner et al. | |
| 5,289,580 A | 2/1994 | Latif et al. | |
| 5,295,164 A | 3/1994 | Yamamura | |
| 5,304,952 A | 4/1994 | Quiet et al. | |
| 5,311,481 A | 5/1994 | Casper et al. | |
| 5,311,483 A | 5/1994 | Takasugi | |
| 5,313,431 A | 5/1994 | Uruma et al. | |
| 5,315,269 A | 5/1994 | Fujii | |
| 5,315,388 A | 5/1994 | Shen et al. | |
| 5,321,368 A | 6/1994 | Hoelzle | |
| 5,327,365 A | 7/1994 | Fujisaki et al. | |
| 5,337,285 A | 8/1994 | Ware et al. | |
| 5,341,405 A | 8/1994 | Mallard, Jr. | |
| 5,347,177 A | 9/1994 | Lipp | |
| 5,347,179 A | 9/1994 | Casper et al. | |
| 5,355,037 A | 10/1994 | Andresen et al. | |
| 5,355,391 A | 10/1994 | Horowitz et al. | |
| 5,361,002 A | 11/1994 | Casper | |
| 5,367,649 A | 11/1994 | Cedar | |
| 5,379,299 A | 1/1995 | Schwartz | |
| 5,383,143 A | 1/1995 | Crouch et al. | |
| 5,390,308 A | 2/1995 | Ware et al. | |
| 5,400,283 A | 3/1995 | Raad | |
| 5,402,389 A | 3/1995 | Flannagan et al. | |
| 5,408,640 A | 4/1995 | MacIntyre et al. | |
| 5,410,263 A | 4/1995 | Waizman | |
| 5,416,436 A | 5/1995 | Rainard | |
| 5,416,909 A | 5/1995 | Long et al. | |
| 5,420,544 A | 5/1995 | Ishibashi | |
| 5,424,687 A | 6/1995 | Fukuda | |
| 5,428,311 A | 6/1995 | McClure | |
| 5,428,317 A | 6/1995 | Sanchez et al. | |
| 5,430,408 A | 7/1995 | Ovens et al. | |
| 5,430,676 A | 7/1995 | Ware et al. | |
| 5,432,823 A | 7/1995 | Gasbarro et al. | |
| 5,438,545 A | 8/1995 | Sim | |
| 5,440,260 A | 8/1995 | Hayashi et al. | |
| 5,440,514 A | 8/1995 | Flannagan et al. | |
| 5,444,667 A | 8/1995 | Obara | |
| 5,446,696 A | 8/1995 | Ware et al. | |
| 5,448,193 A | 9/1995 | Baumert et al. | |
| 5,451,898 A | 9/1995 | Johnson | |
| 5,457,407 A | 10/1995 | Shu et al. | |
| 5,463,337 A | 10/1995 | Leonowich | |
| 5,465,076 A | 11/1995 | Yamauchi et al. | |
| 5,473,274 A | 12/1995 | Reilly et al. | |
| 5,473,575 A | 12/1995 | Farmwald et al. | |
| 5,473,639 A | 12/1995 | Lee et al. | |
| 5,485,490 A | 1/1996 | Leung et al. | |
| 5,488,321 A | 1/1996 | Johnson | |
| 5,489,864 A | 2/1996 | Ashuri | |
| 5,497,127 A | 3/1996 | Sauer | |
| 5,497,355 A | 3/1996 | Mills et al. | |
| 5,498,990 A | 3/1996 | Leung et al. | |
| 5,499,274 A | 3/1996 | Brown | |
| 5,500,808 A | 3/1996 | Wang | |
| 5,502,672 A | 3/1996 | Kwon | |
| 5,506,814 A | 4/1996 | Hush et al. | |
| 5,508,638 A | 4/1996 | Cowles et al. | |
| 5,513,327 A | 4/1996 | Farmwald et al. | |
| 5,515,403 A | 5/1996 | Sloan et al. | |
| 5,532,714 A | 7/1996 | Knapp et al. | |
| 5,539,345 A | 7/1996 | Hawkins | |
| 5,544,124 A | 8/1996 | Zagar et al. | |
| 5,544,203 A | 8/1996 | Casasanta et al. | |
| 5,550,515 A | 8/1996 | Liang et al. | |
| 5,550,549 A | 8/1996 | Procter, Jr. et al. | |
| 5,550,783 A | 8/1996 | Stephens, Jr. et al. | |
| 5,552,727 A | 9/1996 | Nakao | |
| 5,555,429 A | 9/1996 | Parkinson et al. | |
| 5,557,224 A | 9/1996 | Wright et al. | |
| 5,557,781 A | 9/1996 | Stones et al. | |
| 5,563,546 A | 10/1996 | Tsukada | |
| 5,568,075 A | 10/1996 | Curran et al. | |
| 5,568,077 A | 10/1996 | Sato et al. | |
| 5,572,557 A | 11/1996 | Aoki | |
| 5,572,722 A | 11/1996 | Vogley | |
| 5,574,698 A | 11/1996 | Raad | |
| 5,576,645 A | 11/1996 | Farwell | |
| 5,577,079 A | 11/1996 | Zenno et al. | |
| 5,577,236 A | 11/1996 | Johnson et al. | |
| 5,578,940 A | 11/1996 | Dillon et al. | |
| 5,578,941 A | 11/1996 | Sher et al. | |
| 5,579,326 A | 11/1996 | McClure | |

| | | |
|---|---|---|
| 5,581,197 A | 12/1996 | Motley et al. |
| 5,589,788 A | 12/1996 | Goto |
| 5,590,073 A | 12/1996 | Arakawa et al. |
| 5,594,690 A | 1/1997 | Rothenberger et al. |
| 5,610,558 A | 3/1997 | Mittel et al. |
| 5,614,855 A | 3/1997 | Lee et al. |
| 5,619,473 A | 4/1997 | Hotta |
| 5,621,340 A | 4/1997 | Lee et al. |
| 5,621,690 A | 4/1997 | Jungroth et al. |
| 5,621,739 A | 4/1997 | Sine et al. |
| 5,623,523 A | 4/1997 | Gehrke |
| 5,627,780 A | 5/1997 | Malhi |
| 5,627,791 A | 5/1997 | Wright et al. |
| 5,631,872 A | 5/1997 | Naritake et al. |
| 5,636,163 A | 6/1997 | Furutani et al. |
| 5,636,173 A | 6/1997 | Schaefer |
| 5,636,174 A | 6/1997 | Rao |
| 5,638,335 A | 6/1997 | Akiyama et al. |
| 5,642,082 A | 6/1997 | Jefferson |
| 5,644,605 A | 7/1997 | Whiteside |
| 5,644,743 A | 7/1997 | Barrett, Jr. et al. |
| 5,646,904 A | 7/1997 | Ohno et al. |
| 5,652,530 A | 7/1997 | Ashuri |
| 5,657,289 A | 8/1997 | Hush et al. |
| 5,657,481 A | 8/1997 | Farmwald et al. |
| 5,663,921 A | 9/1997 | Pascucci et al. |
| 5,666,313 A | 9/1997 | Ichiguchi |
| 5,666,322 A | 9/1997 | Conkle |
| 5,668,763 A | 9/1997 | Fujioka et al. |
| 5,668,774 A | 9/1997 | Furutani |
| 5,673,005 A | 9/1997 | Pricer |
| 5,675,274 A | 10/1997 | Kobayashi et al. |
| 5,675,588 A | 10/1997 | Maruyama et al. |
| 5,692,165 A | 11/1997 | Jeddeloh et al. |
| 5,694,065 A | 12/1997 | Hamasaki et al. |
| 5,708,611 A | 1/1998 | Iwamoto et al. |
| 5,712,580 A | 1/1998 | Baumgartner et al. |
| 5,712,883 A | 1/1998 | Miller et al. |
| 5,717,730 A | 2/1998 | Prakash et al. |
| 5,719,508 A | 2/1998 | Daly |
| 5,737,342 A | 4/1998 | Ziperovich |
| 5,740,123 A | 4/1998 | Uchida |
| 5,751,665 A | 5/1998 | Tanoi |
| 5,764,092 A | 6/1998 | Wada et al. |
| 5,764,709 A | 6/1998 | Whiteside |
| 5,767,715 A | 6/1998 | Marquis et al. |
| 5,768,177 A | 6/1998 | Sakuragi |
| 5,774,699 A | 6/1998 | Nagae |
| 5,778,214 A | 7/1998 | Taya et al. |
| 5,781,499 A | 7/1998 | Koshikawa |
| 5,784,422 A | 7/1998 | Heermann |
| 5,789,947 A | 8/1998 | Sato |
| 5,790,612 A | 8/1998 | Chengson et al. |
| 5,794,020 A | 8/1998 | Tanaka et al. |
| 5,805,931 A | 9/1998 | Morzano et al. |
| 5,812,619 A | 9/1998 | Runaldue |
| 5,822,314 A | 10/1998 | Chater-Lea |
| 5,831,545 A | 11/1998 | Murray et al. |
| 5,831,929 A | 11/1998 | Manning |
| 5,841,707 A | 11/1998 | Cline et al. |
| 5,852,378 A | 12/1998 | Keeth |
| 5,872,959 A | 2/1999 | Nguyen et al. |
| 5,889,828 A | 3/1999 | Miyashita et al. |
| 5,889,829 A | 3/1999 | Chiao et al. |
| 5,898,242 A | 4/1999 | Peterson |
| 5,898,674 A | 4/1999 | Mawhinney et al. |
| 5,909,130 A | 6/1999 | Martin et al. |
| 5,909,474 A | 6/1999 | Yoshizawa |
| 5,917,760 A | 6/1999 | Millar |
| 5,920,518 A | 7/1999 | Harrison et al. |
| 5,926,047 A | 7/1999 | Harrison |
| 5,926,436 A | 7/1999 | Toda et al. |
| 5,940,608 A | 8/1999 | Manning |
| 5,940,609 A | 8/1999 | Harrison |
| 5,945,855 A | 8/1999 | Momtaz |
| 5,946,244 A | 8/1999 | Manning |
| 5,953,284 A | 9/1999 | Baker et al. |
| 5,953,386 A | 9/1999 | Anderson |
| 5,964,884 A | 10/1999 | Partovi et al. |
| 5,990,719 A | 11/1999 | Dai et al. |
| 6,002,273 A | 12/1999 | Humphreys |
| 6,005,694 A | 12/1999 | Liu |
| 6,005,823 A | 12/1999 | Martin et al. |
| 6,011,732 A | 1/2000 | Harrison et al. |
| 6,011,822 A | 1/2000 | Dreyer |
| 6,014,042 A | 1/2000 | Nguyen |
| 6,016,282 A | 1/2000 | Keeth |
| 6,021,268 A | 2/2000 | Johnson |
| 6,023,489 A | 2/2000 | Hatch |
| 6,026,050 A | 2/2000 | Baker et al. |
| 6,026,134 A | 2/2000 | Duffy et al. |
| 6,029,250 A | 2/2000 | Keeth |
| 6,038,219 A | 3/2000 | Mawhinney et al. |
| 6,067,592 A | 5/2000 | Farmwald et al. |
| 6,072,802 A | 6/2000 | Uhm et al. |
| 6,087,857 A | 7/2000 | Wang |
| 6,101,152 A | 8/2000 | Farmwald et al. |
| 6,101,197 A | 8/2000 | Keeth et al. |
| 6,105,157 A | 8/2000 | Miller |
| 6,107,849 A | 8/2000 | Williams et al. |
| 6,115,318 A | 9/2000 | Keeth |
| 6,119,242 A | 9/2000 | Harrison |
| 6,125,157 A | 9/2000 | Donnelly et al. |
| 6,147,905 A | 11/2000 | Seino |
| 6,147,916 A | 11/2000 | Ogura |
| 6,150,889 A | 11/2000 | Gulliver et al. |
| 6,160,423 A | 12/2000 | Haq |
| 6,173,432 B1 | 1/2001 | Harrison |
| 6,194,917 B1 | 2/2001 | Deng |
| 6,253,360 B1 | 6/2001 | Yoshiba |
| 6,259,755 B1 | 7/2001 | O'Sullivan et al. |
| 6,262,921 B1 | 7/2001 | Manning |
| 6,269,451 B1 | 7/2001 | Mullarkey |
| 6,285,726 B1 | 9/2001 | Gaudet |
| 6,295,328 B1 | 9/2001 | Kim et al. |
| 6,298,450 B1 | 10/2001 | Liu et al. |
| 6,327,196 B1 | 12/2001 | Mullarkey |
| 6,327,318 B1 | 12/2001 | Bhullar et al. |
| 6,338,127 B1 | 1/2002 | Manning |
| 6,359,945 B1 | 3/2002 | Doblar |
| 6,377,646 B1 | 4/2002 | Sha |
| 6,378,079 B1 | 4/2002 | Mullarkey |
| 6,396,888 B1 | 5/2002 | Notani et al. |
| 6,430,696 B1 | 8/2002 | Keeth |
| 6,438,043 B2 | 8/2002 | Gans et al. |
| 6,442,644 B1 | 8/2002 | Gustavson et al. |
| 6,484,244 B1 | 11/2002 | Manning |
| 6,493,320 B1 | 12/2002 | Schober et al. |
| 6,499,111 B2 | 12/2002 | Mullarkey |
| 6,526,111 B1 | 2/2003 | Prasad |
| 6,580,531 B1 | 6/2003 | Swanson et al. |
| 6,665,222 B2 | 12/2003 | Wright et al. |
| 6,694,496 B2 | 2/2004 | Goslin et al. |
| 6,809,555 B1 | 10/2004 | Nguyen |
| 6,931,086 B2 | 8/2005 | Harrison |
| 6,952,462 B2 | 10/2005 | Harrison |
| 7,358,784 B2 | 4/2008 | Kim et al. |
| 7,418,071 B2 | 8/2008 | Harrison |
| 7,428,284 B2 | 9/2008 | Lin |
| 7,602,876 B2 | 10/2009 | Harrison |
| 2001/0024135 A1 | 9/2001 | Harrison |
| 2008/0126059 A1 | 5/2008 | Harrison |
| 2008/0195908 A1 | 8/2008 | Manning |
| 2008/0301533 A1 | 12/2008 | Lee et al. |

FOREIGN PATENT DOCUMENTS

| | | |
|---|---|---|
| EP | 0 406 786 A1 | 1/1991 |
| EP | 0 450 871 A2 | 10/1991 |
| EP | 0 476 585 A2 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A2 | 4/1996 |
| EP | 0 704 975 A1 | 4/1996 |
| EP | 0 767 538 A1 | 4/1997 |
| JP | 6-1237512 A | 10/1986 |
| JP | 2-112317 A | 4/1990 |

| | | | |
|---|---|---|---|
| JP | 4-135311 | A | 5/1992 |
| JP | 5-136664 | A | 6/1993 |
| JP | 5-282868 | A | 10/1993 |
| JP | 0-7319577 | A | 12/1995 |
| WO | 94/29871 | A1 | 12/1994 |
| WO | 95/22200 | A1 | 8/1995 |
| WO | 95/22206 | A1 | 8/1995 |
| WO | 96/10866 | A1 | 4/1996 |
| WO | 97/14289 | A2 | 4/1997 |
| WO | 97/42557 | A2 | 11/1997 |

OTHER PUBLICATIONS

Alvarez, J. et al. "A Wide-Bandwidth Low Voltage PLL for PowerPC .TM. Microprocessors" IEEE IEICE Trans. Electron., vol. E-78. No. 6, Jun. 1995, pp. 631-639.
Anonymous "Pulse Combining Network", IBM Technical Disclosure Bulletin, vol. 32, No. 12, May 1990, pp. 149-151.
Anonymous, "Draft Standard for a High-Speed Memory Interface (SyncLink)", Microprocessor and Microcomputer Standards Subcommittee of the IEEE Computer Society, Copyright 1996 by the Institute of Electrical and Electronics Engineers, Inc., New York,NY, pp. 1-56.
Anonymous, "Programmable Pulse Generator", IBM Technical Disclosure Bulletin, vol. 17, No. 12, May 1975, pp. 3553-3554.
Anonymous, "Pulse Combining Network", IBM Technical Disclosure Bulletin, vol. 32, No. 12, May 1990, pp. 149-151.
Anonymous, "Variable Delay Digital Circuit", IBM Technical Disclosure Bulletin, vol. 35, No. 4A, Sep. 1992, pp. 365-366.
Arai, Y. et al., "A CMOS Four Channel x 1K Time Memory LSI with 1-ns/b Resolution", IEEE Journal of Solid-State Circuits, vol. 27, No. 3, M, 8107 Mar. 1992, No. 3, New York, US, pp. 59-364 and pp. 528-531.
Arai, Y. et al., "A Time Digitizer CMOS Gate-Array with a 250 ps Time Resolution", XP 000597207, IEEE Journal of Solid-State Circuits, vol. 31, No. 2, Feb. 1996, pp. 212-220.
Aviram, A. et al., "Obtaining High Speed Printing on Thermal Sensitive Special Paper With a Resistive Ribbon Print Head", IBM Technical Disclosure Bulletin, vol. 27, No. 5, Oct. 1984, pp. 3059-3060.
Bazes, M. "Two Novel Fully Complementary Self-Biased CMOS Differential Amplifiers", IEEE Journal of Solid-State Circuits, vol. 26, No. 2, Feb. 1991, pp. 165-168.
Chapman et al., "A Low-Cost High-Performance CMOS Timing Vernier for ATE", International Test Conference 1995 Proceedings, Oct. 21-25, 1995,pp. 459-468.
Cho, J. "Digitally-Controlled PLL with Pulse Width Detection Mechanism for Error Correction", ISSCC 1997, Paper No. SA 20.3, pp. 334-335.
Christiansen, J., "An Integrated High Resolution CMOS Timing Generator Based on an Array of Delay Locked Loops", IEEE Journal of Solid-State Circuits, vol. 31, No. 7, Jul. 1996, pp. 952-957.
Combes, M. et al., "A Portable Clock Multiplier Generator Using Digital CMOS Standard Cells", IEEE Journal of Solid-Circuits, vol. 31, No. 7, Jul. 1996, pp. 958-965.
Descriptive literature entitled, "400MHz SLDRAM, 4M×16 SLDRAM Pipelined, Eight Bank, 2.5 V Operation," SLDRAM Consortium Advance Sheet,published throughout the United States, pp. 1-22.
Donnelly, K. et al., "A 660 MB/s Interface Megacell Portable Circuit in 0.3 .mu.m-0 7 .mu.m CMOS ASIC", IEEE Journal of Solid-State Circuits, vol. 31, No. 12, Dec. 1996, pp. 1995-2001.
Goto, J. et al., "A PLL-Based Programmable Clock Generator with 50- to 350-MHz Oscillating Range for Video Signal Processors", IEICE Trans. Electron., vol. E77-C, No. 12, Dec. 1994, pp. 1951-1956.
Gustavsion, David B., et al., "IEEE Standard for Scalable Coherent Interface (SCI)," IEEE Computer Society, IEEE Std. 1596-1992, Aug. 2, 1993.
Hamamoto, T., "400-MHz Random Column Operating SDRAM Techniques with Self-Skew Compensation", IEEE Journal of Solid-State Circuits, vol. 33, No. 5, May 1998, pp. 770-778.

Ishibashi, A. et al., "High-Speed Clock Distribution Architecture Employing PLL for 0.6 .mu.m CMOS SOG", IEEE Custom Integrated Circuits Conference, 1992, pp. 27.6.1-27.6.4.
Kikuchi, S. et al., "A Gate-Array-Based 666Mhz VLSI Test System", IEEE International Test Conference, Paper 21.1, 1995, pp. 451-458.
Kim, B. et al., "A 30MHz High-Speed Analog/Digital PLL in 2 .mu.m CMOS", ISSCC, Feb. 1990.
Ko, U. et al., "A 30-ps Jitter, 3.6- .mu.s Locking, 3.3-Volt Digital PLL for CMOS Gate Arrays", IEEE Custom Integrated Circuits Conference, 1993, pp. 23.3.1-23.3.4.
Lee, T. et al., "A 2.5V Delay-Locked Loop for an 18Mb 500MB/s DRAM", IEEE International Solid-State Circuits Conference Digest of Technical Papers, Paper No. FA 18.6, 1994, pp. 300-301.
Lesmeister, G., "A Densely Integrated High Performance CMOS Tester", International Test Conference, Paper 16.2, 1991, pp. 426-429.
Ljuslin, C. et al., "An Integrated 16-channel CMOS Time to Digital Converter", IEEE Nuclear Science Symposium & Medical Imaging Conference Record, vol. 1, 1993, pp. 625-629.
Maneatis, J., "Low-Jitter Process-Independent DLL and PLL Based on Self-Biased Techniques", IEEE Journal of Solid-State Circuits, vol. 31, No. 11, Nov. 1996, pp. 1723-1732.
Nakamura, M. et al., "A 156 MBPS CMOS Clock Recovery Circuit for Burst-mode Transmission", Symposium on VLSI Circuits Digest of Technical Papers, 1996, pp. 122-123.
Nielson, E., "Inverting latches make simple VCO", EDN, Jun. 19, 1997, Five Pages.
Novof, I. et al., "Fully Integrated CMOS Phase-Locked Loop with 15 to 240 MHz Locking Range and .+-.50 ps Jitter", IEEE Journal of Solid-State Circuits, vol. 30, No. 11, Nov. 1995, pp. 1259-1266.
Park, D. et al., "Fast Acquisition Frequency Synthesizer with the Multiple Phase Detectors", IEEE Pacific Rim Conference on Communications, Computers and Signal Processing, vol. 2, May 1991. pp. 665-668.
Saeki, T. et al., "A 2.5-ns Clock Access, 250-MHz, 256-Mb SDRAM with Synchronous Mirror Delay", IEEE Journal of Solid-State Circuits, vol. 31, No. 11, Nov. 1996, pp. 1656-1665.
Santos et al., "A CMOS Delay Lacked Loop and Sub-Nanosecond Time-to-Digital Converter Chip", Nuclear Science Symposium and Medical Imaging Record, IEEE 1995, vol. 1, pp. 289-291, Oct. 21-28, 1995.
Shirotori, T. et al., "PLL-based, Impedance Controlled Output Buffer", 1991 Symposium on VLSI Circuits Digest of Technical Papers, pp. 49-50.
Sidiropoulos, S. et al., "A 700-Mb/s/pin CMOS Signaling Interface Using Current Integrating Receivers", IEEE Journal of Solid-State Circuits, vol. 32, No. 5, May 1997, pp. 681-690.
Sidiropoulos, S. et al., "A CMOS 500 Mbps/pin synchronous point to point link interface", IEEE Symposium on VLSI Circuits Digest of Technical Papers, 1994, pp. 43-44.
Sidiropoulos, S. et al., "A Semi-Digital DLL with Unlimited Phase Shift Capability and 0.08-400MHz Operating Range," IEEE International Solid State Circuits Conference, Feb. 8, 1997, pp. 332-333.
Soyuer, M. et al., "A Fully Monolithic 1.25GHz CMOS Frequency Synthesizer", IEEE Symposium on VLSI Circuits Digest of Technical Papers, 1994, pp. 127-128.
Taguchi, M. et al., "A 40-ns 64-Mb DRAM with 64-b Parallel Data Bus Architecture", IEEE Journal of Solid-State Circuits, vol. 26, No. 11, Nov. 1991, pp. 1493-1497.
Tanoi, S. et al., "A 250-622 MHz Deskew and Jitter Suppressed Clock Buffer Using Two-Loop Architecture", IEEE IEICE Trans. Electron., vol. E-79-C. No. 7, Jul. 1996, pp. 898-904.
Watson, R. et al., "Clock Buffer Chip with Absolute Delay Regulation Over Process and Environmental Variations", IEEE Custom Integrated Circuits Conference, 1992, pp. 25.2.1-25.2.5.
Yoshimura, T. et al. "A 622-Mb/s Bit/Frame Synchronizer for High-Speed Backplane Data Communication", IEEE Journal of Solid-State Circuits, vol. 31, No. 7, Jul. 1996, pp. 1063-1066.
von Kaenel, V. et al., "A 320 MHz, 1.5 mW @ 1.35 V CMOS PLL for Microprocessor Clock Generation", IEEE Journal of Solid-State Circuits, vol. 31, No. 11, Nov. 1996, pp. 1715-1722.

METHOD AND APPARATUS FOR GENERATING A PHASE DEPENDENT CONTROL SIGNAL

CROSS-REFERENCE TO RELATED APPLICATIONS

This application is a continuation of U.S. patent application Ser. No. 12/562,709 which is scheduled to issue as U.S. Pat. No. 8,107,580 on Jan. 31, 2012, which is a continuation of U.S. patent application Ser. No. 12/178,442 filed Jul. 23, 2008, which issued as U.S. Pat. No. 7,602,876 on Oct. 13, 2009, which is a continuation of U.S. patent application Ser. No. 11/203,511, filed Aug. 12, 2005, which issued as U.S. Pat. No. 7,418,071 on Aug. 26, 2008, which is a continuation of U.S. patent application Ser. No. 10/186,471, filed Jun. 28, 2002, which issued as U.S. Pat. No. 7,016,451 on Mar. 21, 2006, which is a continuation of U.S. patent application Ser. No. 09/260,212, filed Mar. 1, 1999, which issued as U.S. Pat. No. 6,470,060 on Oct. 22, 2002, all of which are hereby incorporated herein by reference.

BACKGROUND OF THE INVENTION

This invention relates to generating a control signal and, more particularly, to generating a control signal based on the phase relationship between two input clock signals, and to memory devices and computer systems using such control signal generators.

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at a frequency that is substantially lower than the clock frequency of the processor. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a packetized memory device known as a SLDRAM memory device. In the SLDRAM architecture, the system memory may be coupled to the processor, either directly through the processor bus or through a memory controller.

Rather than requiring that separate address and control signals be provided to the system memory, SLDRAM memory devices receive command packets that include both control and address information. The SLDRAM memory device then outputs or receives data on a data bus that may be coupled directly to the data bus portion of the processor bus. A master clock signal transmitted to each memory device is used to synchronize data transfer between the processor and memory device and also serves as a basis from which to generate internal clock signals coordinating internal memory operations.

One of the factors limiting the access speed of SLDRAM memory devices is the speed at which the command buffer of each device can store and process the command packets. The processing speed of the command buffer is dependent on the control of the relative timing between transmission of the command packets from the processor and an internal clock signal ICLK of the memory device used to trigger a latch in the command buffer to capture the command signals. Both the command signals and the ICLK signal are delayed relative to receipt of the command packet on a command bus and a command clock signal CMDCLK. Furthermore, the amount of the delay is highly variable, and it is difficult to control. If the delay of the internal clock signal ICLK cannot be precisely controlled, it may cause the latch in the command buffer to latch invalid command signals. Thus, the speed at which command packets can be applied to the memory device is limited by the delays in the memory device. Similar problems exist for other control signals in the memory device that control the operation of the memory device during each clock cycle, such as latching of data in the memory device and in a memory controller.

Consequently, the operation of a SLDRAM memory architecture necessitates the generation of a sequence of clock signals having predetermined phases relative to a master clock signal. Phase-locked and delay locked loops have been employed to ensure the precise phase relationship between clock signals. In such a closed loop, there is typically a phase detector receiving two clock signals, and a voltage controlled delay circuit through which one clock signal passes. The voltage controlled delay circuit receives control signals from the phase detector that are used adjust the variable delay value in order to establish a predetermined phase relationship between the two clock signals. For example, where the desired phase relationship between two clock signals is zero degrees, the phase detector will detect any phase difference between the two clock signals and generate a control signal that is transmitted to the voltage controlled delay circuit. The delay circuit will adjust the delay value according to the control signal until the clock signal passing through the voltage controlled delay circuit is synchronized with the other clock signal. The clock control circuitry in an SLDRAM is described in greater detail in U.S. patent application Ser. Nos. 08/879,847, 08/890,055, 08/933,324, 08/994,461, 09/146,716, and 09/150,079, which are incorporated herein by reference.

A single phase detector connected to a CMOS inverter has been used as a means of providing a control signal to the above-described voltage controlled delay circuits. As shown in FIG. 1, clock signals CLK 1 and CLK 2 are applied to two pulse generating circuits 11, 12, each of which includes a NAND gate 16 receiving a respective clock signal directly and through three series connected inverters 18, 20, 22. The output of each pulse generating circuit 11, 12 set and reset a flip-flop 26 formed by cross-coupled NAND gates 28, 30. A single output of the flip-flop 26 is connected to the gates of an inverter 36 formed by a PMOS transistor 38 and an NMOS transistor 40. A current source 44 supplies current to the source of the PMOS transistor 38, and a current sink 46 draws current from the source of the NMOS transistor 40. When the output from the flip-flop 26 is low, the PMOS transistor 38 is turned ON and the NMOS transistor 40 is turned OFF. In this condition, a conductive path is created for the current source 44 to couple current to a capacitor 48. A control signal VOUT is generated by the capacitor 48. When the current source 44 is applying current to the capacitor 48, the voltage of the control signal VOUT increases linearly. In the alternative case where the output from the flip-flop 26 is high, the PMOS transistor 38 is switched OFF and the NMOS transistor 40 is switched ON. The current sink 46 is then coupled to the capacitor 48 to draw current from the capacitor 48. The voltage of the control signal VOUT then decreases linearly. As a result, the control signal VOUT has a sawtooth waveform component.

The problem with using a single phase detector connected to an inverter 36, as shown in FIG. 1, is that even after the voltage controlled delay circuit has been adjusted so the clock signals have the predetermined phase relationship, the circuit will nevertheless continue to generate a sawtooth ripple voltage at its output. The sawtooth waveform component of the control signal VOUT is transmitted to the voltage controlled delay circuit (not shown in FIG. 1), which is forced to constantly adjust the delay value, and consequently, the phase relationship between the two clock signals CLK 1 and CLK 2. The closed loop system will oscillate around a center-point and continue to "hunt" for the optimum control voltage value.

The result is a "phase jitter" imparted to clock signals used to latch command and data signals. Although the phase jitter introduced by the sawtooth ripple voltage may be acceptable in some applications, in high speed memory applications where the clock frequencies are high and the need to control the phase relationship between clock signals is critical, the clocks signals may fail to correctly latch command and data signals.

To accommodate the problems associated with the sawtooth ripple, the memory system designer may relax the timing requirements of the memory system by slowing down the clock frequencies and reducing the operating speed of the memory device. However, this approach defeats the primary purpose of developing high speed memory systems. Therefore, there is a need for a phase detector that generates a control signal that does not vary when the input clock signals have been adjusted to a predetermined phase relationship.

BRIEF SUMMARY OF THE INVENTION

A phase detector used for generating a control signal based on the phase relationship between two clock signals. The phase detector includes two phase detector circuits that each provide to a charge pump or a phase dependent signal source select signals based on the phase relationship of the clock signals. The charge pump receives the select signals and produces a current output signal according to combination of the select signals from the phase detector circuits. The current output signal may be converted into a control signal by connecting a capacitor to the output of the charge pump. Significantly, the phase detector produces a non-varying control signal when the two clock signals have a predetermined phase relationship. The use of two phase detectors and the charge pump to generate control signals avoids the presence of a sawtooth ripple voltage at the output of the charge pump.

BRIEF DESCRIPTION OF THE DRAWINGS

FIG. 4, comprising

DETAILED DESCRIPTION

Figure 2:
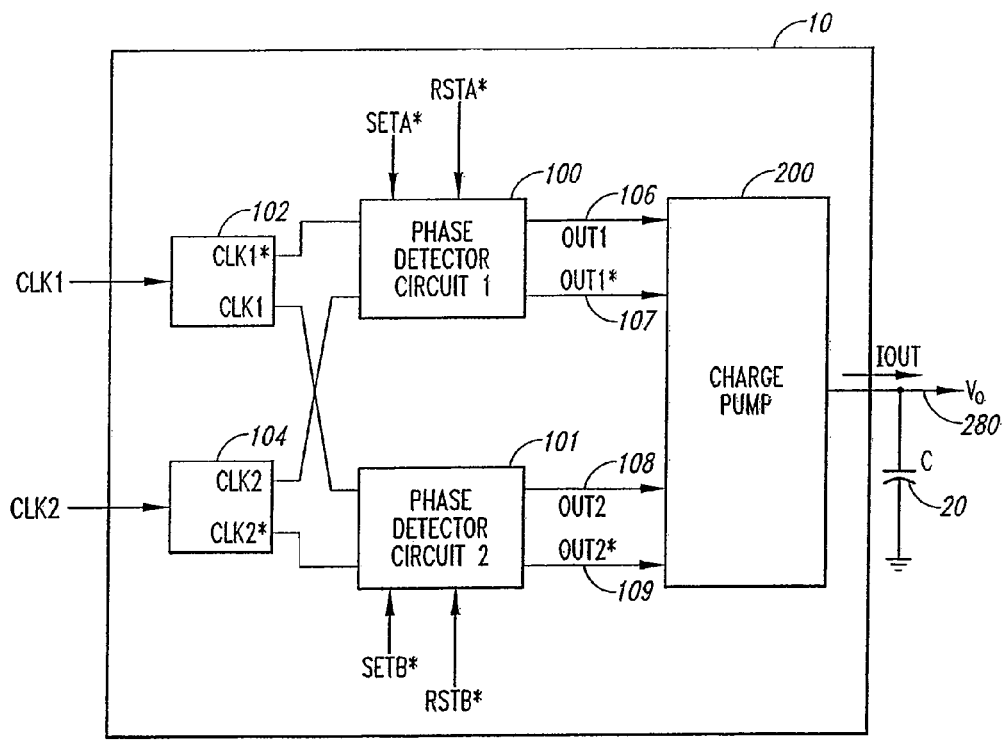
FIG. 2 is a block diagram illustrating a phase detector including two phase detector circuits connected to a charge pump.

An embodiment of a phase detector 10 in accordance with the present invention is illustrated in FIG. 2. The phase detector includes two single-to-dual signal converters 102, 104 that receive input clock signals CLK 1, CLK 2, respectively, and produce complementary clock signals CLK 1*, CLK 2* and non-complementary clock signals CLK 1, CLK 2 based on the original input clock signals. The single-to-dual signal converters may be implemented using a variety of designs known to one skilled in the art. For example, an inverter and transfer gate having the same propagation delay connected in parallel will produce a complementary and a non-complementary signal from an input clock signal. The CLK 1, CLK 1*, CLK 2, CLK 2* signals are transmitted to two phase detector circuits 100, 101 that produce select signals OUT 1, OUT 1*, OUT 2, OUT 2* and transmits them to a phase dependent signal source or a charge pump 200 via signal lines 106, 107, 108, 109, respectively. The charge pump 200 in turn generates an output current IOUT according to the OUT 1, OUT 1* signals from the phase detector circuit 100, and the OUT 2, OUT 2* signals from the phase detector circuit 101. The IOUT current may be converted into a control signal V0 by capacitor 20 connected to an output 280, and the control signal V0 may be used to adjust the delay value of a voltage controlled delay circuit.

Figure 3:
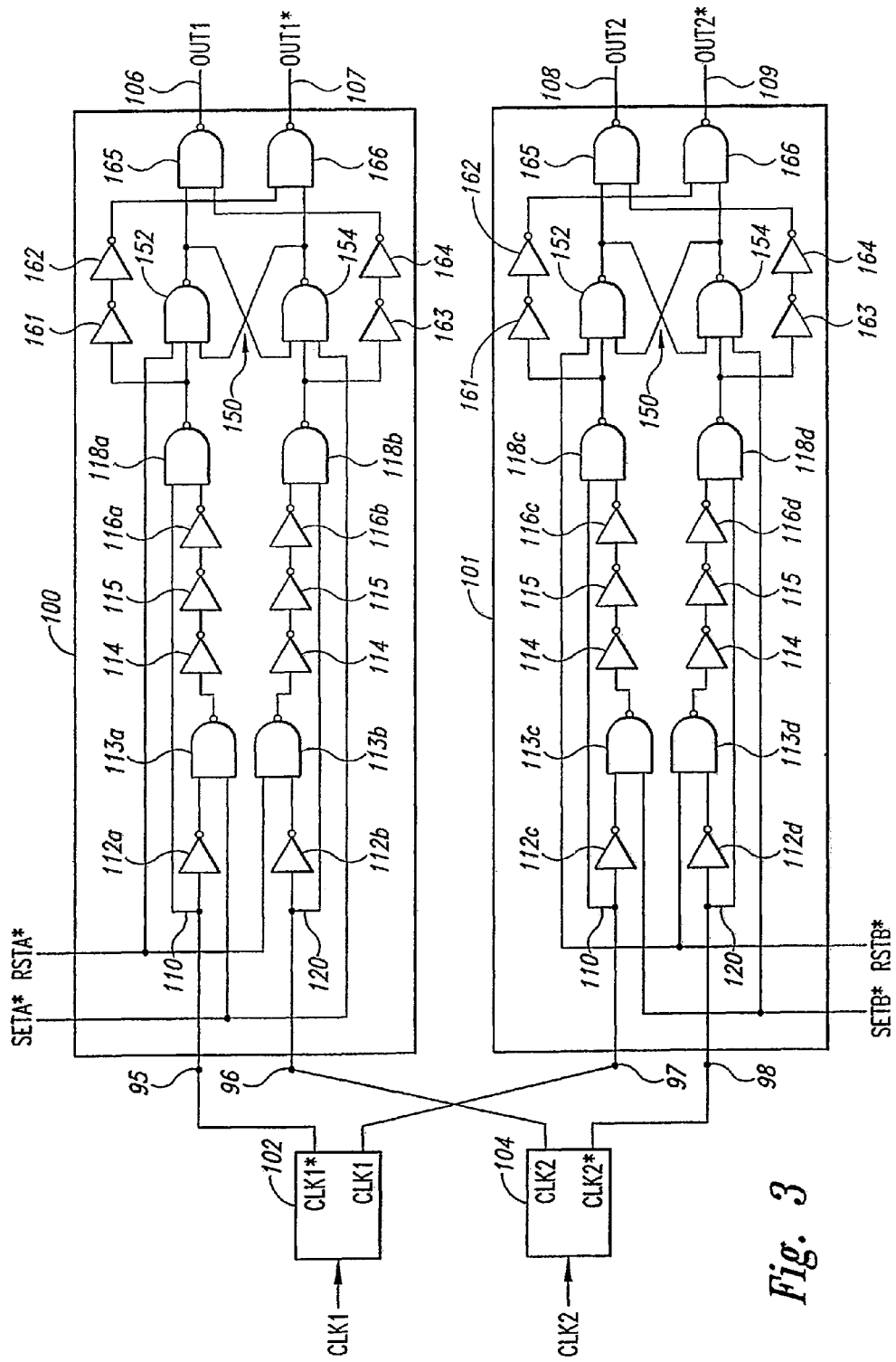
FIG. 3 is a logic diagram of the phase detector circuits of FIG. 2 in accordance with an embodiment of the present invention.

FIG. 3 illustrates an embodiment of the phase detector circuits 100, 101 in greater detail. Each detector circuit 100, 101 consists of two signal transition detectors 110, 120 that generate a trigger pulse upon detecting a low-to-high transition of an input clock signal it receives. Each detector circuit 100, 101 also includes a dual output flip-flop 150 that is set and reset by the trigger pulses it receives from the signal transitions detectors 110, 120. Each flip-flop 150 is formed by a pair of cross-coupled NAND gates 152, 154. The output from the phase detector circuits 100, 101 are applied to NAND gates 165, 166 through inverters 161-164. Each NAND gate 165, 166 also receives a respective input signal from the flip-flop 150. The combination of inverters 161-164 and NAND gates 165, 166 creates a buffer circuit that will cause the respective NAND gates 165, 166 to immediately switch upon receiving a trigger pulse from the respective signal transition detector, as explained below.

Each phase detector circuit 100, 101 receives a pair of active-low control signals, SETA*, RSTA*, and SETB*, RSTB*, respectively. The SETA* and RSTA* signals are applied to the phase detector circuit 100, and the SETB* and RSTB* signals are applied to the phase detector circuit 101. The control signals are generated by a control circuit (not shown), and are used to put each phase detector circuit 100, 101 into a predetermined state. Signal RSTA* is provided directly to the NAND gate 152 of the flip-flop 150 and the NAND gate 113 of the signal transition detector 120, and signal SETA* is provided directly to the NAND gate 154 of the flip-flop 150 and the NAND gate 113 of the signal transition detector 110. The RSTB*, SETB* signals are similarly provided to the respective NAND gates of the phase detector circuit 101.

To illustrate the operation of the control signals, consider the effect the SETA*, RSTA* signals have on phase detector circuit 100. During normal operation of the phase detector circuit 100, the RSTA* and SETA* signals are both high. In this situation, the NAND gates 113 of the signal transition detectors 110, 120 behave as inverters, and the NAND gates 152, 154 behave as simple two input NAND gates.

However, when the SETA* signal goes low, the output of the NAND gates 113a and 154 are forced high. Consequently, the NAND gate 118a outputs a high to the NAND gate 152, and the NAND gate 118b outputs a low that sets the flip-flop 150. The OUT 1 signal is then forced high and the OUT 1* signal is forced low. In a similar manner, when the RSTA* signal goes low, the flip-flop 150 is reset so that the OUT 1 signal is forced low and the OUT 1* signal is forced high. Control signals RSTB* and SETB* operate in the same manner for the phase detector circuit 101 by forcing the OUT 2, OUT 2* signals to a predetermined state when active. To simplify the explanation of the operation of the signal transition detectors 110, 120, it will be assumed that the SETA*, RSTA*, SETB*, and RSTB* signals are inactive (i.e., at a high signal level).

In operation, the CLK 1, CLK 2 signals are initially low thereby applying a low signal directly to one input of the NAND gates 118b, 118c and causing the inverters 116a, 116d to apply low signals to the other input of the NAND gates 118a, 118 d, respectively. Thus, the NAND gates 118a-d initially output a high signal. When the respective clock signal goes high, e.g., the CLK 1 signal, the NAND gate 118c outputs a low signal until the high signal has propagated through inverter 112c, NAND gate 113c, and through series inverters 114c, 115c, 116c. The inverter of 116 c then applies a low signal to the NAND gate 118c, thereby causing the output of the NAND gate 118 c to again go high. Thus, the signal transition detector 110 outputs a low-going pulse responsive to the CLK 1 signal. The low-going pulse has a width equal to the total propagation delay through inverter 112, NAND gate 113, and series inverters 114, 115, 116. The signal transition detectors 110, 120 in the phase detector circuit 100, and the signal transition detector 120 in the phase detector circuit 101, each operate in the same manner to output a low pulse responsive to the rising edge of the clock signal to which it is connected.

The low-going pulse from each of the signal transition detectors 110, 120 sets or resets the flip-flops 150. More specifically, each flip-flop 150 is set by each pulse from the respective signal transition detector 110, thereby causing the NAND gate 152 to output a high signal and the NAND gate 154 to output a low signal. Each flip-flop 150 is reset by each pulse from the respective signal transition detector 120, thereby causing the NAND gate 152 to output a low signal and NAND gate 154 to output a high signal. The output of NAND gates 152, 154 are then inverted by NAND gates 165, 166, respectively, of the buffer circuit to provide the OUT 1, OUT 1*, OUT 2, OUT 2* signals to the charge pump 200. As a result, the OUT 1 signal is high during the period between the rising edge of the CLK 2 signal and the falling edge of the CLK 1 signal (i.e., the rising edge of the CLK 1* signal). In a similar manner, the OUT 2 signal generated by the detector circuit 101 is high during the period between the falling edge of the CLK 2 signal (i.e., the rising edge of the CLK 2* signal) and the rising edge of the CLK 1 signal.

To illustrate the operation of the phase detector circuits 100, 101, consider three situations: first, where CLK 1 and CLK 2 are in phase; second, where CLK 1 is leading CLK 2 by $\phi$; and third, where CLK 1 is lagging CLK 2 by $\phi$.

Figure 4A:
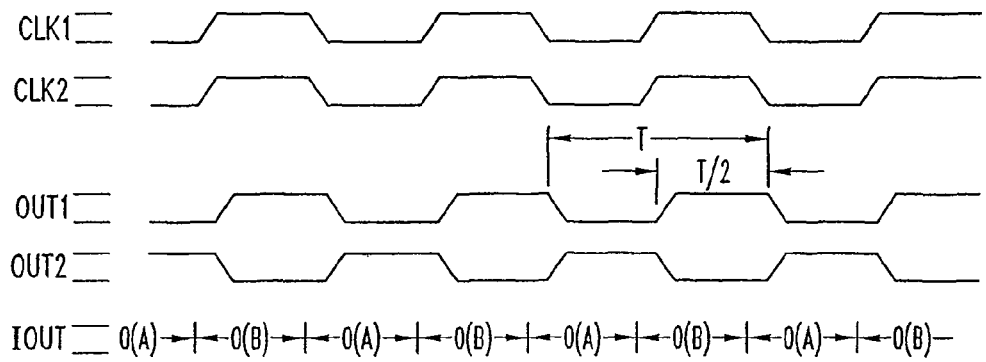
FIGS. 4a-4c, is a timing diagram showing several of the waveforms present in the phase detector circuits.

The phase relationship when the CLK 1 and CLK 2 signals are in phase is illustrated in FIG. 4a. As explained above, the OUT 1 signal from the phase detector circuit 100 switches from low to high on the rising edge of the CLK 2 signal, and from high to low on the falling edge of the CLK 1 signal. Also, the OUT 2 signal from the phase detector circuit 101 switches from low to high on the falling edge of the CLK 2 signal, and from high to low on the rising edge of the CLK 1 signal. Since the CLK 1 signal is shown in FIG. 4 a as being in phase with the CLK 2 signal, the duty cycles of the OUT 1 and OUT 2 signals are both 50 percent, and the two signals will never be at the same logic level simultaneously.

Figure 4B:
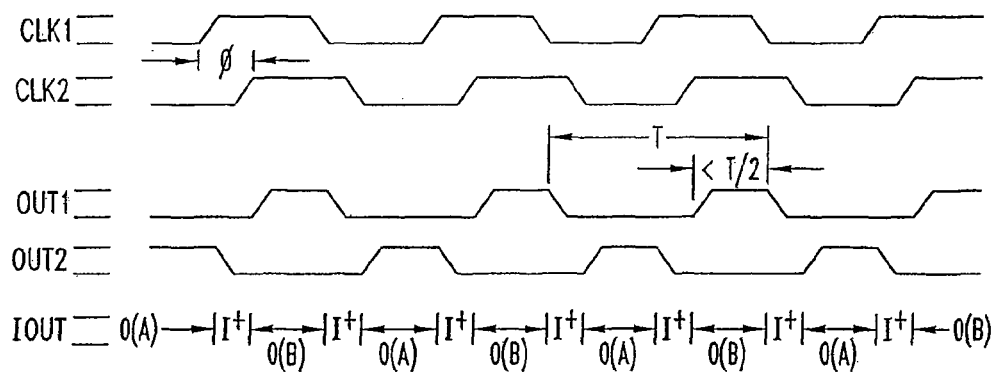
Figure 4C:
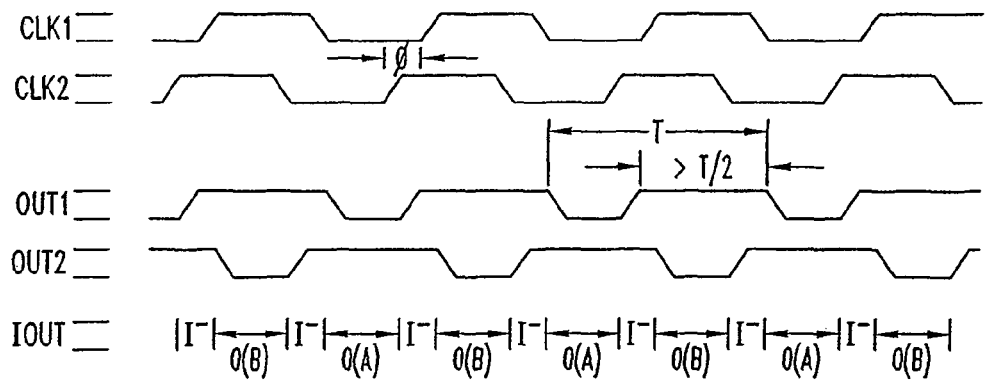

Now consider the case where CLK 1 is leading CLK 2 by $\phi$, as shown in FIG. 4b. When CLK 1 is leading CLK 2 by $\phi$, the OUT 1 signal from the phase detector circuit 100 and the OUT 2 signal from phase the detector circuit 101 have duty cycles less than 50 percent, and may be at a low logic level simultaneously. Finally, consider the case where CLK 1 is lagging CLK 2 by $\phi$, as shown in FIG. 4c. When CLK 1 is lagging CLK 2 by $\phi$, the resulting OUT 1 and OUT 2 signals from phase detector circuits 100 and 101, respectively, have duty cycles greater than 50 percent. Thus, the OUT 1 and OUT 2 signals may be at a high logic level simultaneously.

Figure 1:
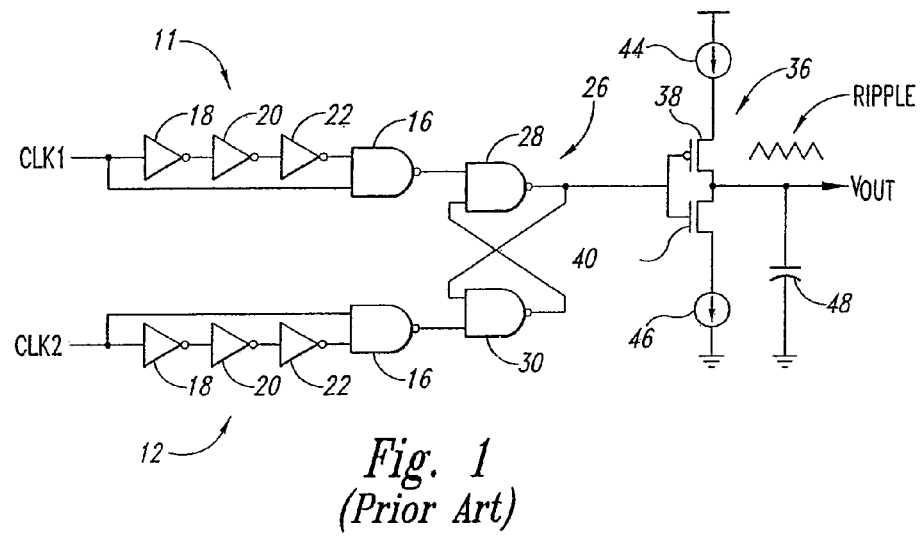
FIG. 1 is a logic diagram of a conventional phase detector circuit and charge pump.
Figure 5:
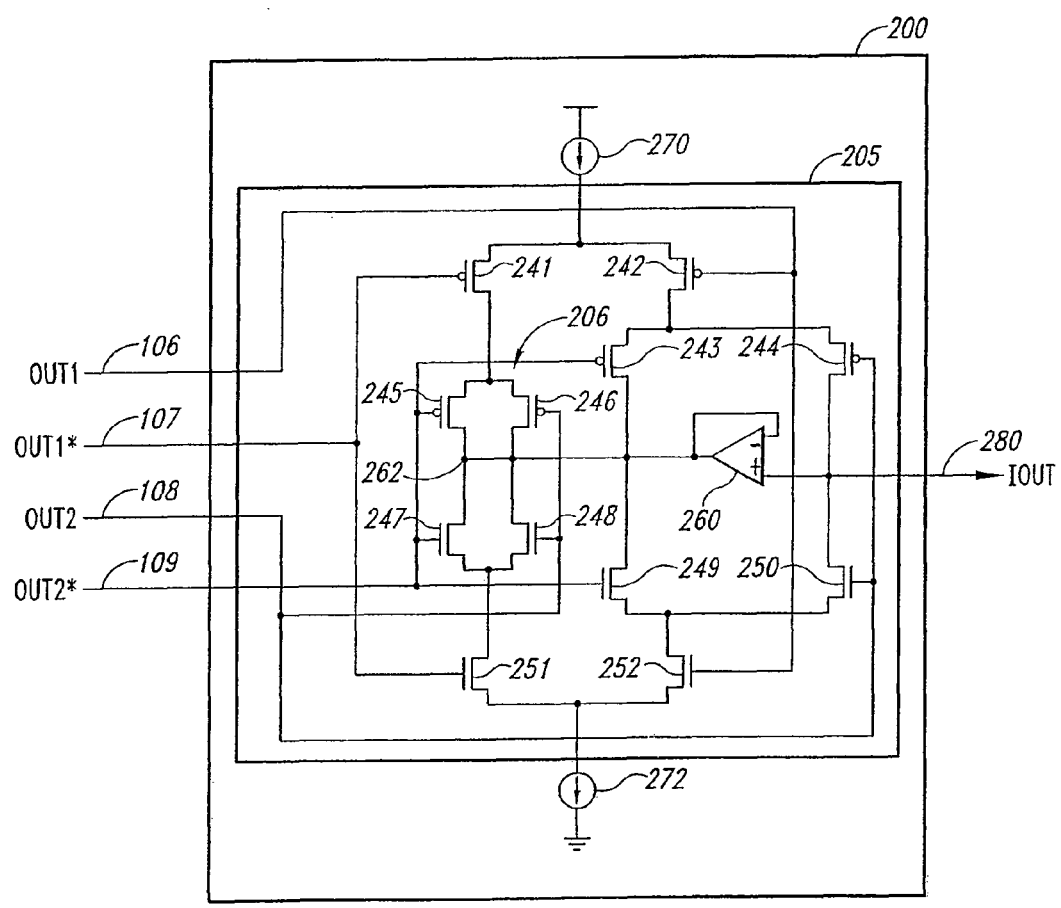
FIG. 5 is a logic diagram of the charge pump of FIG. 2 in accordance with an embodiment of the present invention.

The OUT 1, OUT 1*, OUT 2, OUT 2* signals are transmitted from the phase detector circuits 100, 101 on signal lines 106, 107, 108, 109, respectively, to the input of a charge pump, such as a charge pump 200, as shown in FIG. 5. The charge pump 200 includes a charging circuit 205, a current source 270, and a current sink 272. The function of the charging circuit 205 is to direct the current of the current source 270 and current sink 272 into, or out of the capacitor (FIG. 2), respectively, depending upon the relative duty cycles of the OUT 1 and OUT 2 signals. Significantly, no current flows into or out of the capacitor 20 when the CLK 1 and CLK 2 signals are in phase. Thus, the resulting control signal may have virtually no ripple when the phase detector 10 (FIG. 2) is used in a voltage controlled delay circuit, as explained above. A clock signal generated using the voltage controlled delay circuit has significantly less phase jitter compared to a clock signal generated by a voltage controlled delay circuit using the phase detector of FIG. 1.

The charge pump 200 includes transistors 245-248 on the left leg of the charging circuit 205 to form a compensation circuit 206 to compensate for current and voltage changes in a current driving circuit formed by transistors 243, 244, 249, and 250 on the right leg of the charging circuit 205. The compensation circuit 206 is provided so that the voltage across the charging circuit 205 is relatively constant during operation, regardless of where the currents of the current source 270 and the current sink 272 are being directed.

A voltage follower 260 is connected between the output 280 of the charging circuit 205 and node 262 of the compensation circuit 206. The voltage follower 260 provides a current path from the current source 270 to ground when current from the current sink 272 is being directed out of the capacitor 20. The voltage follower 260 also provides a current path from the current sink 272 to the positive supply when current from the current source 270 is directed to the output 280. As will be explained in greater detail below, both of these situations occur where the CLK 1 and CLK 2 signals are not in phase. As a result, the current through the charging circuit 205 is through two PMOS transistors and two NMOS transistors when current is being directed into or out of the capacitor 20, namely, the transistors 242, 244, 247, 251 or the transistors 241, 245, 250, 252. Similarly, in the situations where no current is being directed into or out of the capacitor 20, the current through the charging circuit 205 is also through two PMOS transistors and two NMOS transistors, namely, the transistors 242, 243, 248, 251 or the transistors 241, 246, 249, 252. Consequently, the operating points of the active transistors will remain relatively constant, and any capacitive charge pumping on the internal nodes of the charging circuit 205 will be minimized. It will be appreciated by one ordinarily skilled in the art that the transistors of the charging circuit 205 must be scaled accordingly.

To illustrate the operation of the charge pump 200 in conjunction with the phase detector circuits 100, 101, consider again the three situations that were described earlier: where CLK 1 and CLK 2 are in phase; where CLK 1 is leading CLK 2 by φ; and where CLK 1 is lagging CLK 2 by φ.

As shown in FIG. 4a, when OUT 1 is low and OUT 2 is high the current provided by the current source 270 and sunk by the current sink 272 bypasses the output 280 of the charging circuit 205 and simply flows through the transistors 242, 243, 248, 251 (indicated in FIG. 4a as "0(A)"). Similarly, when OUT 1 is high and OUT 2 is low current flows from the current source 270 to the current sink 272 through the transistors 241, 246, 249, 252 (indicated in FIG. 4a as "0(B)"). In either case, the charging circuit 205 does not charge or discharge the capacitor 20 so the voltage on the capacitor 20 remains constant.

As shown in FIG. 4b, when both the OUT 1 and OUT 2 signals are low, the charging circuit 205 directs the current provided by the current source 270 through the PMOS transistors 242, 244 to charge the capacitor 20 (indicated in FIG. 4b as "I+"). A path for the current from the current sink 272 is provided through the voltage follower 260 and the NMOS transistors 247, 251. During the time the OUT 1 and OUT 2 signals are at different logic levels, the charging circuit 205 does not charge or discharge the capacitor 20 so the voltage on the capacitor 20 remains constant, as was previously explained (indicated in FIG. 4b as 0(A) or 0(B)).

As shown in FIG. 4c, when both the OUT 1 and OUT 2 signals are high, the NMOS transistors 250, 252 provide a conductive path for the current sink 272 to sink current from the capacitor 20 (indicated in FIG. 4c as "I−"). A current path for the current of the current source 270 is provided through the voltage follower 260 and the PMOS transistors 241, 245. As mentioned before, whenever the OUT 1 and OUT 2 signals are at different logic levels, the charging circuit 205 does not charge or discharge the capacitor 20 so the voltage on the capacitor 20 remains constant (indicated in FIG. 4c as 0(A) or 0(B)).

Any change in the control voltage $V_O$ depends upon whether current is flowing into or out of the capacitor 20, as explained above. When the CLK 1 and CLK 2 signals are in phase, as illustrated in FIG. 4a, OUT 1 and OUT 2 never have the same logic level so no current flows either into or out of the capacitor 20. In contrast, when the CLK 1 signal and the CLK 2 signal have different phases, OUT 1 and OUT 2 are both high or both low for a portion of each cycle. As illustrated in FIG. 4b, when the CLK 1 signal leads the CLK 2 signal, OUT 1 and OUT 2 are low for more than 50 percent of each cycle so that OUT 1 and OUT 2 are both low for a portion of each cycle. As a result, as explained above, current flows into the capacitor 20, thereby increasing the control voltage $V_O$. Similarly, when the CLK 1 signal lags the CLK 2 signal as illustrated in FIG. 4c, OUT 1 and OUT 2 are high for more than 50 percent of each cycle so that OUT 1 and OUT 2 are both high for a portion of each cycle. As a result, current flows out of the capacitor 20, thereby decreasing the control voltage $V_O$.

The discussion of the phase detector 10 has so far only considered the case where the CLK 1 and CLK 2 signals are adjusted so that they are approximately in phase. However, the phase detector 10 may be modified to produce a control signal that adjust the CLK 1 and CLK 2 signals to have a 180 degrees phase relationship. As shown in FIG. 3, the CLK 1* and CLK 2 signals are transmitted to nodes 95, 96 of the phase detector circuit 100, while the CLK 1 and CLK 2* signals are transmitted to nodes 97, 98 of the phase detector circuit 101, resulting in a phase detector that generates a non-varying control signal when the CLK 1 and CLK 2 signals are in phase. However, when the CLK 1 and CLK 1* signals are reconnected to the nodes 95 and 97, respectively, or the CLK 2 and CLK 2* signals are reconnected to the nodes 98 and 96, respectively, the phase detector circuits 100, 101 transmit the OUT 1, OUT 1*, OUT 2, OUT 2* signals to the charge pump 200 so that the phase detector 10 generates a non-varying control signal when the CLK 1 and CLK 2 signals have a 180 degree phase relationship.

The current source 270 and the current sink 272 of the charge pump 200 may be of any current source circuit known in the art. In a preferred embodiment, a high-swing cascode current mirror, as described in "CMOS Circuit Design, Layout, and Simulation," published by IEEE Press, is used for both the current source 270 and the current sink 272. The use of this particular current source is meant for illustrative purposes only, and is not intended to limit the scope of the present invention.

The charge pump 200 (FIG. 2) has been described with respect to the embodiment illustrated in FIG. 5. However, an integrator circuit using an operational amplifier may also be used for the charge pump 200. Such an integrator circuit is formed by coupling a capacitor across the output of the operational amplifier and the inverting input. The OUT 1 and OUT 2 signals generated by the phase detector circuits 100 and 101 are applied through two resistors of equal resistance to the non-inverting input of the operational amplifier, and the OUT 1* and OUT 2* signals are applied through two resistors of equal resistance to the inverting input. The resulting charge pump will generate increasing and decreasing control signals when the CLK 1 and CLK 2 signals are not in phase, and generate a control signal with virtually no ripple when the clock signals are in phase.

Figure 6:
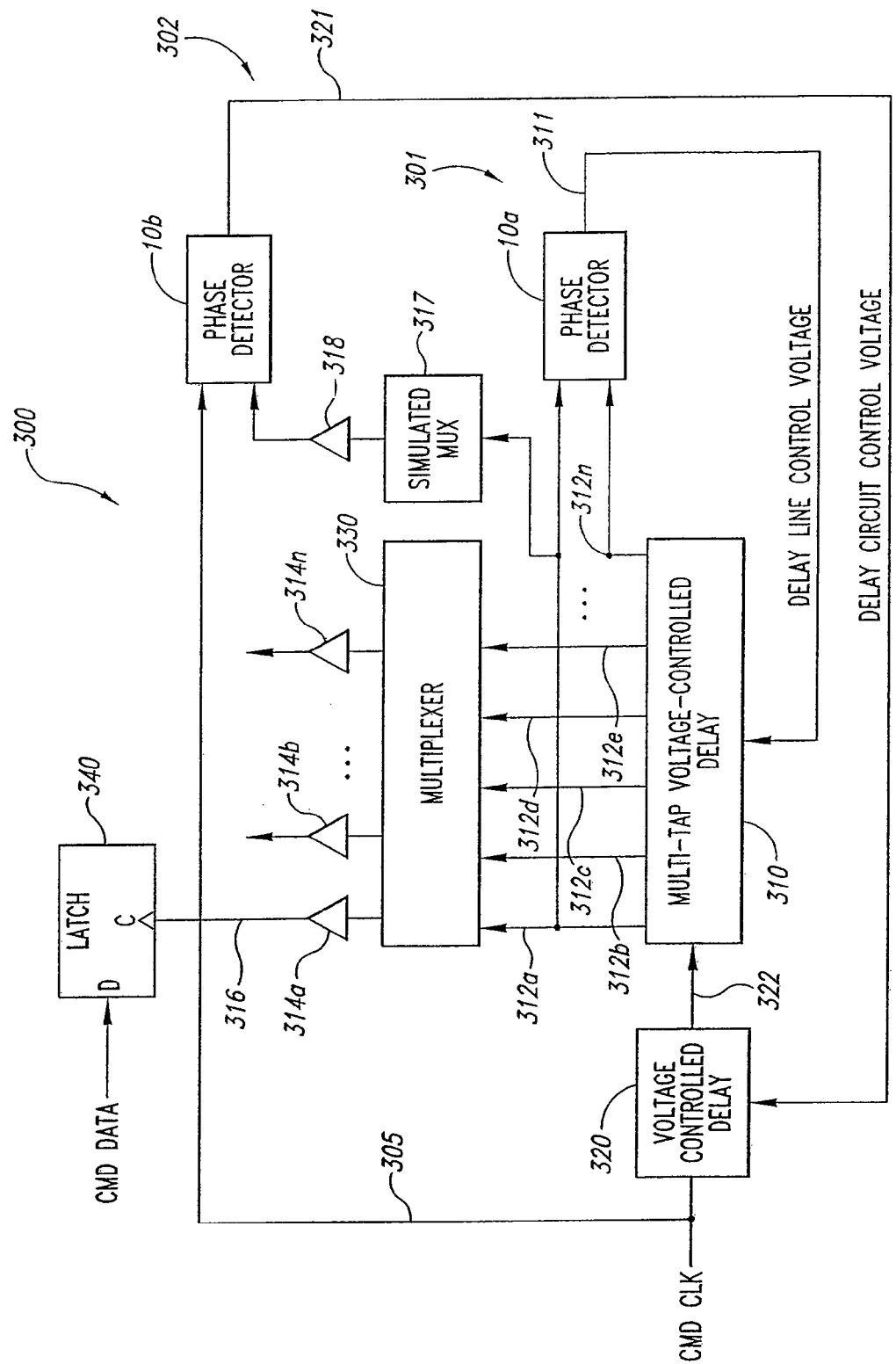
FIG. 6 is a block diagram of a clock generator circuit using an embodiment of the phase detector of FIG. 2.

Shown in FIG. 6 is a block diagram of a clock generator circuit that may be used in packetized DRAMs to provide a sequence of clock signals that have predetermined phases relative to a master clock signal. The clock generator circuit contains a first delay-locked loop 301 and a second delay-locked loop 302, each having a phase detector 10 of FIG. 2. A multiplexer 330 having a plurality of output lines coupled to respective clock drivers 314a-n may be coupled to the first delay-lock loop 301 to couple one of the clock signals produced by the multi-tap voltage controlled delay circuit 310 to a clock output terminal 316 for use, for example, with a latch 340 to latch command data CMD DATA in packetized DRAM. The multiplexer 330 couples the input of each of the clock drivers 314a-n to any one of the clock signals produced by the multi-tap voltage controlled delay circuit 310.

The first delay-locked loop includes a multi-tap voltage controlled delay circuit 310 and a first phase detector 10a. The multi-tap voltage controlled delay circuit 310 generates a sequence of clock signals on output lines 312a-312n that are increasingly delayed from a first clock signal on line 312a to a last clock signal on line 312n. Two of the clock signals, preferably the first and last clock signals, are locked to each other using the delay-locked loop 301 so that they have a predetermined phase with respect to each other. For example, the first clock signal on line 312a and the last clock signal on line 312n may be locked so that they are the inverse of each other, that is, the predetermined phase relationship is 180 degrees from each other. Alternatively, the predetermined phase relationship could be 360 degrees so the first and last clock signals are in phase. The first phase detector 10a compares the phase of the clock signals on lines 312a and 312n and generates the first control signal as a function of the phase difference therebetween. The first control signal is provided to the multi-tap voltage-controlled delay circuit 310 on line 311 to adjust the relative delay between the clock signal on line 312a and line 312n. The phase detector 10a will continue to provide the first control signal until the first and last clock signals have obtained the predetermined phase relationship.

Likewise, the second delay-locked loop 302 includes a second voltage controlled delay circuit 320 and a second phase detector 10b. A second delay-locked loop locks a clock signal from the multi-tap voltage controlled circuit 310 to a master clock signal CMD CLK on line 305 so that the increasingly delayed clock signals of the multi-tap voltage controlled delay circuit 310 have phase delays with respect to the CMD CLK signal. The clock signal from the multi-tap voltage controlled circuit 310 is provided to an input of the second phase detector 10b through a simulated multiplexer 317 and a clock driver 318. The relative phase delays of the simulated multiplexer 317 and the clock driver 318 are nearly identical to that of the multiplexer 330 and the clock drivers 314a-n. Consequently, the phase detector 10 b will receive a clock signal having the same relative phase delay as a clock signal output by the clock drivers 314a-n.

For example, the second delay-lock loop 302 may delay lock the first clock signal on line 312a to the CMD CLK signal so that they have substantially the same phase, that is, the predetermined phase relationship is zero degrees from each other. The voltage controlled delay circuit 320 receives the CMD CLK signal and generates a reference clock signal on line 322 having a delay relative to the CMD CLK signal that is a function of a second control signal on line 321. The clock signal on line 322 is provided to the multi-tap voltage controlled circuit 310 and used to generate the sequence of increasingly delayed clock signals 312a-312n.

The second phase detector 10b compares the phase of the CMD CLK signal to the phase of the first clock signal on line 312a and generates a second control signal as a function of the difference therebetween. The clock signal provided to the phase detector 10b is delayed through the simulated multiplexer 317 and the clock driver 318 approximately the same amount as the clock signals output by the clock drivers 314a-n. The second control signal is used to adjust the delay value of the voltage controlled delay circuit 320. The second control signal is provided by the second phase detector 10b until the CMD CLK signal and the first clock signal from the multi-tap voltage controlled circuit 310 have obtained the predetermined phase relationship. The clock generator circuit of FIG. 6 is described in greater detail in U.S. patent application Ser. No. 08/879,847, which, as mentioned above, has been incorporated herein by reference.

Figure 7:
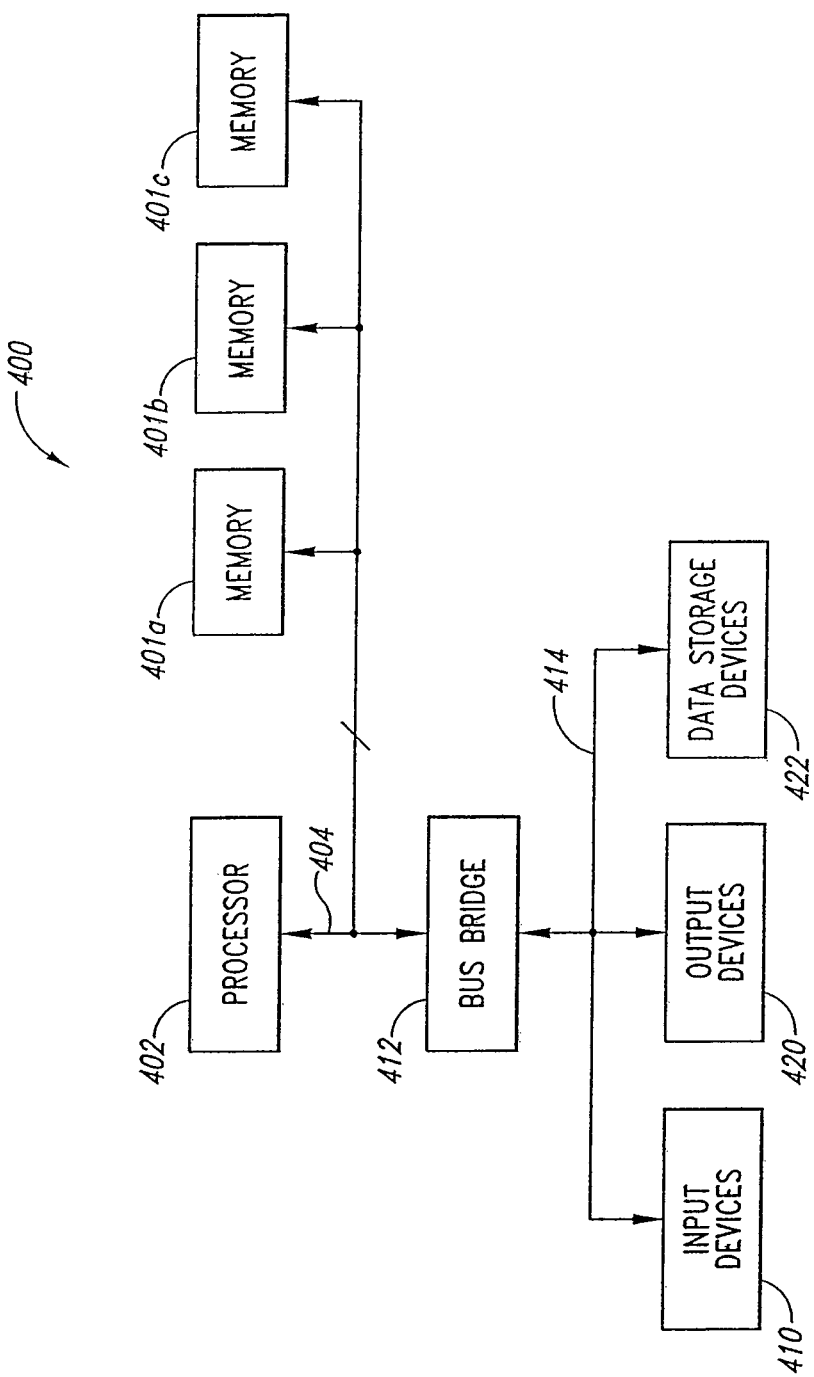
FIG. 7 is a block diagram of a computer system using a plurality of DRAMs, each of which includes the phase detector of FIG. 2.

A computer system using the phase detector 10 of FIG. 2 in each of a plurality of packetized DRAMs 401 is shown in FIG. 7. With reference to FIG. 7 the computer system 400 includes a processor 402 having a processor bus 404 coupled to three packetized dynamic random access memory or SLDRAMs 401a-c. The computer system 400 also includes one or more input devices 410, such as a keypad or a mouse, coupled to the processor 402 through a bus bridge 412 and an expansion bus 414, such as an industry standard architecture ("ISA") bus or a Peripheral component interconnect ("PCI") bus. The input devices 410 allow an operator or an electronic device to input data to the computer system 400. One or more output devices 420 are coupled to the processor 402 to display or otherwise output data generated by the processor 402. The output devices 420 are coupled to the processor 402 through the expansion bus 414, bus bridge 412 and processor bus 404. Examples of output devices 420 include printers and video display units. One or more data storage devices 422 are coupled to the processor 402 through the processor bus 404, bus bridge 412, and expansion bus 414 to store data in or retrieve data from storage media (not shown). Examples of storage devices 422 and storage media include fixed disk drives floppy disk drives, tape cassettes and compact-disk read-only memory drives.

In operation, the processor 402 communicates with the memory devices 401a-c via the processor bus 404 by sending the memory devices 401a-c command packets that contain both control and address information. Data is coupled between the processor 402 and the memory devices 401a-c, through a data bus portion of the processor bus 404. Although all the memory devices 401a-c are coupled to the same conductors of the processor bus 404, only one memory device 401a-c at a time reads or writes data, thus avoiding bus contention on the processor bus 404. Bus contention is avoided by each of the memory devices 401a-c and the bus bridge 412 having a unique identifier, and the command packet contains an identifying code that selects only one of these components.

The computer system 400 also includes a number of other components and signal lines which have been omitted from FIG. 7 in the interests of brevity. For example, as explained above, the memory devices 401a-c also receive a command or master clock signal to provide internal timing signals, a data clock signal clocking data into and out of the memory device 401a-c, and a FLAG signal signifying the start of a command packet.

From the foregoing it will be appreciated that, although specific embodiments of the invention have been described herein for purposes of illustration, various modifications may be made without deviating from the spirit and scope of the invention. For example, the signal transition detector circuits 110, 120 have been described as generating a negative trigger pulse upon detecting a transition of an input signal. However, using cross-coupled NOR gates instead of cross-coupled NAND gates for the flip-flop 150 allows the use of a signal transition detector that generates a positive trigger pulse. Also, the charge pump 200 shown in FIG. 5 is described as generating a current output signal IOUT having a positive polarity when CLK 1 is leading CLK 2, and having a negative polarity when CLK 1 is lagging CLK 2. However, the connection of the OUT 1, OUT 1*, OUT 2, OUT 2* signals to the transistors 241-252 of the charging circuit 205 may be modified so that the IOUT signal will have a negative polarity when CLK 1 is leading CLK 2, and have a positive polarity when CLK 1 is lagging CLK 2. Accordingly, the invention is not limited except as by the appended claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory coupled to the processor bus adapted to allow data to be stored, the memory comprising:
a command data latch circuit for storing a command data packet at a time determined from a command clock signal, the command data latch comprising:
a latch circuit having a data input and a clock input, the data input being adapted to receive the command data packet and store the command data packet responsive to a clock signal applied to the clock input; and
a clock generator circuit for generating a latch signal from a master clock signal, the clock generator circuit comprising:
a first delay-lock loop having a first voltage controlled delay circuit receiving a reference clock signal and generating a sequence of clock signals which are increasingly delayed from the reference clock signal to a last clock signal by delaying the reference clock signal by respective delays that are a function of a first control signal, and
a phase detector comparing the phase of first and second clock signals in the sequence and generating the first control signal as a function of the phase difference therebetween, the phase detector comprising:
a first input configured to receive the first clock signal;
a second input configured to receive the second clock signal; and
a charge pump comprising an output terminal, a first current source, and a second current source, and wherein the charge pump is configured to cause the first and second current sources to bypass the output terminal responsive to the first and second clock signals being substantially in phase,
wherein the charge pump comprises a first switching device and a second switching device coupled in series between the first current source and the output terminal, and wherein one of the first and second switching devices is configured to substantially prevent current flow between the first current source and the output terminal responsive to the first and second clock signals being in phase, and;
wherein the charge pump comprises a third switching device and a fourth switching device coupled in series between the second current source and the output terminal, and wherein one of the third and fourth switching devices is configured to substantially prevent current flow between the second current source and the output terminal responsive to the first and second clock signals being in phase.

2. The computer system of claim 1, wherein the charge pump is further configured to couple the first current source to the output terminal responsive to the first clock signal leading the second clock signal.

3. The computer system of claim 2, wherein the charge pump is further configured to couple the second current source to the output terminal responsive to the first clock signal lagging the second clock signal.

4. The computer system of claim 1, wherein the first and second switching devices are configured to substantially allow current flow between the first current source and the output terminal responsive to the first clock signal leading the second clock signal.

5. The computer system of claim 1, wherein the third and fourth switching devices are configured to substantially allow current flow between the second current source and the output terminal responsive to the first clock signal lagging the second clock signal.

6. The computer system of claim 1, further comprising:
a first phase detector circuit configured to receive the first and second clock signals and generate a first control signal indicative of a time between a rising edge of the second clock signal and a falling edge of the first clock signal;
a second phase detector circuit configured to receive the first and second clock signals and generate a second control signal indicative of a time between a rising edge of the first clock signal and a falling edge of the second clock signal; and
wherein the first and third switching devices are configured to receive the first control signal and wherein the second and fourth switching devices are configured to receive the second control signal.

7. The phase detector of claim 1, further comprising a compensation circuit coupled between the first and second current sources and configured to maintain a substantially constant voltage between the first and second current sources.

8. A computer system, comprising:
a processor having a processor bus;
an input device coupled to the processor through the processor bus adapted to allow data to be entered into the computer system;

an output device coupled to the processor through the processor bus adapted to allow data to be output from the computer system; and a memory coupled to the processor bus adapted to allow data to be stored, the memory comprising:

a command data latch circuit for storing a command data packet at a time determined from a command clock signal, the command data latch comprising: a latch circuit having a data input and a clock input, the data input being adapted to receive the command data packet and store the command data packet responsive to a clock signal applied to the clock input; and a clock generator circuit for generating a latch signal from a master clock signal, the clock generator circuit having a phase detector, for providing a control signal according to the phase relationship between first and second clock signals, the phase detector comprising:

a first input configured to receive the first clock signal;

a second input configured to receive the second clock signal; and a charge pump comprising an output terminal, a first current source, and a second current source, and wherein the charge pump is configured to cause the first and second current sources to bypass the output terminal responsive to the first and second clock signals being substantially in phase, wherein the charge pump comprises a first switching device and a second switching device coupled in series between the first current source and the output terminal, and wherein one of the first and second switching devices is configured to substantially prevent current flow between the first current source and the output terminal responsive to the first and second clock signals being in phase, and;

wherein the charge pump comprises a third switching device and a fourth switching device coupled in series between the second current source and the output terminal, and wherein one of the third and fourth switching devices is configured to substantially prevent current flow between the second current source and the output terminal responsive to the first and second clock signals being in phase.

9. The computer system of claim 8, wherein the charge pump is further configured to couple the first current source to the output terminal responsive to the first clock signal leading the second clock signal.

10. The computer system of claim 9, wherein the charge pump is further configured to couple the second current source to the output terminal responsive to the first clock signal lagging the second clock signal.

11. The computer system of claim 8, wherein the first and second switching devices are configured to substantially allow current flow between the first current source and the output terminal responsive to the first clock signal leading the second clock signal.

12. The computer system of claim 8, wherein the third and fourth switching devices are configured to substantially allow current flow between the second current source and the output terminal responsive to the first clock signal lagging the second clock signal.

13. The computer system of claim 8, further comprising:

a first phase detector circuit configured to receive the first and second clock signals and generate a first control signal indicative of a time between a rising edge of the second clock signal and a falling edge of the first clock signal;

a second phase detector circuit configured to receive the first and second clock signals and generate a second control signal indicative of a time between a rising edge of the first clock signal and a falling edge of the second clock signal; and wherein the first and third switching devices are configured to receive the first control signal and wherein the second and fourth switching devices are configured to receive the second control signal.

14. The computer system of claim 8, further comprising a compensation circuit coupled between the first and second current sources and configured to maintain a substantially constant voltage between the first and second current sources.

15. A computer system, comprising:

a processor having a processor bus; an input device coupled to the processor through the processor bus adapted to allow data to be entered into the computer system;

an output device coupled to the processor through the processor bus adapted to allow data to be output from the computer system; and a memory coupled to the processor bus adapted to allow data to be stored, the memory comprising:

a command data latch circuit for storing a command data packet at a time determined from a command clock signal, the command data latch comprising:

a latch circuit having a data input and a clock input, the data input being adapted to receive the command data packet and store the command data packet responsive to a clock signal applied to the clock input; and a clock generator circuit for generating a latch signal from a master clock signal, the clock generator circuit comprising:

a variable delay unit configured to receive the clock signal and generate a delayed clock signal by an amount based in part on a first control signal, wherein the variable delay unit includes a multi-tap variable delay unit having a plurality of taps, each tap configured to output an intermediate clock signal having a respective delay relative to the clock signal, a delay between at least two of the intermediate clock signals being based in part on a second control signal received by the multi-tap variable delay unit;

a first phase detector configured to receive the clock signal and the delayed clock signal and configured to generate the first control signal based on a phase relationship between the clock signal and the delayed clock signal, wherein the first phase detector is further configured to maintain a substantially constant first control signal responsive to the clock signal and the delayed clock signal having a selected phase relationship; and a second phase detector configured to receive the at least two intermediate clock signals and generate the second control signal based on a phase relationship between the two intermediate clock signals, wherein the second phase detector is further configured to maintain a substantially constant second control signal responsive to the at least two intermediate clock signals having another selected phase relationship.

16. The computer system of claim 15, wherein the first phase detector is further configured to adjust the control signal in a first direction responsive to an indication the clock signal leads the delayed clock signal by an amount greater than that of the selected phase relationship, and wherein the first phase detector is further configured to adjust the control signal in a second direction responsive to an indication the clock signal lags the delayed clock signal by an amount greater than that of the selected phase relationship.

17. The computer system of claim 15, further comprising:
a multiplexer configured to receive the intermediate clock signals generated by the multi-tap variable delay unit and select at least one of the intermediate clock signals to couple to another circuit element; and
a simulated multiplexer coupled between one of the taps of the multi-tap variable delay unit and the first phase detector, the simulated multiplexer configured to simulate a delay generated by the multiplexer.

18. The computer system of claim 15, wherein the phase detector comprises:
a charge pump comprising an output terminal, a first current source, and a second current source, and wherein the charge pump is configured to cause the first and second current sources to bypass the output terminal responsive to the clock signal and the delayed clock signal having the selected phase relationship.

19. The computer system of claim 18, wherein the charge pump further comprises a first and a second switching device coupled in series between the first current source and the output terminal, and wherein one of the first and second switching devices are configured to substantially prevent current flow between the first current source and the output terminal responsive to the clock signal and the delayed clock signals having the selected phase relationship.

* * * * *

UNITED STATES PATENT AND TRADEMARK OFFICE
CERTIFICATE OF CORRECTION

PATENT NO. : 8,433,023 B2  
APPLICATION NO. : 13/354702  
DATED : April 30, 2013  
INVENTOR(S) : Ronnie M. Harrison It is certified that error appears in the above-identified patent and that said Letters Patent is hereby corrected as shown below:

In the Claims

Column 15, line 22, Claim 19, "are" should read --is--.

Signed and Sealed this  
Second Day of June, 2015

Michelle K. Lee  
*Director of the United States Patent and Trademark Office*